US008810881B2

(12) United States Patent
Kim et al.

(10) Patent No.: US 8,810,881 B2
(45) Date of Patent: Aug. 19, 2014

(54) MICRO STRUCTURE, MICRO ACTUATORS, METHOD OF FABRICATING MICRO STRUCTURE AND MICRO ACTUATORS

(75) Inventors: Jongbaeg Kim, Goyang-si (KR); Youngkee Eun, Yongin-si (KR); Jae-Ik Lee, Goyang-si (KR); Jungwook Choi, Seoul (KR); Youngsup Song, Seoul (KR)

(73) Assignee: Industry-Academic Cooperation Foundation Yonsei University, Seoul (KR)

( * ) Notice: Subject to any disclaimer, the term of this patent is extended or adjusted under 35 U.S.C. 154(b) by 324 days.

(21) Appl. No.: 13/487,375

(22) Filed: Jun. 4, 2012

(65) Prior Publication Data

US 2013/0141769 A1 Jun. 6, 2013

(30) Foreign Application Priority Data

Dec. 5, 2011 (KR) ........................ 10-2011-0129274

(51) Int. Cl.
*G02B 26/08* (2006.01)
(52) U.S. Cl.
USPC ...................................... 359/224.1
(58) Field of Classification Search
CPC ........... G02B 26/0833; G02B 26/0841; B81B 2203/0136; B81C 1/0015; B82Y 30/00; Y02E 60/122
USPC ................ 359/223.1–226.1; 216/53; 428/156
See application file for complete search history.

(56) References Cited

U.S. PATENT DOCUMENTS

| 7,089,666 | B2 | 8/2006 | Kim et al. |
| 7,342,346 | B2 | 3/2008 | Kim et al. |
| 2005/0162806 | A1* | 7/2005 | Sarkar et al. .................. 361/277 |

OTHER PUBLICATIONS

Youngkee Eun et al., "Plastic deformation of microstructures using carbon nanotubes film as latching surface," The 16th International Conference on Solid-State Sensors, Actuators and Microsystems (Transducers' 11), pp. 711-714, 2011.
Youngkee Eun et al., "Integrated carbon nanotube array as dry adhesive for high temperature silicon processing," Advanced Materials, vol. 23, Issue 37, 4285-4289, 2011.
Jongbaeg Kim et al., "Microfabricated Torsional Actuators Using Self-Aligned Plastic Deformation," Journal of Microelectromechanical Systems, vol. 15, No. 3, 553-562, 2006.
Jongbaeg Kim et al., "Electrostatic Scanning Micromirrors Using Localized Plastic Deformation of Silicon," Journal of Micromechanics and Microengineerng, vol. 15, No. 9, 1777-1785, 2005.
Jongbaeg Kim et al., "Monolithic 2-D Scanning Mirror Using Self-Aligned Angular Vertical Comb Drives," IEEE Photonics Technology Letters, vol. 17, No. 11, 2307-2309, 2005.
J. Kim et al., "Micro vertical comb actuators by selective stiction process," Sensors and Actuators A—Physical, vol. 127, pp. 248-254, 2006.

(Continued)

*Primary Examiner* — Euncha Cherry
(74) *Attorney, Agent, or Firm* — LRK Patent Law Firm

(57) ABSTRACT

A method for fabricating a micro-structure is provided, which can simply and easily fabricate the micro-structure by a batch process of directly forming a highly aligned nano-material array on a micro-structure to be used as an adhesive material during plastic deformation of the micro-structure without the use of existing complicated fabrication process.

27 Claims, 8 Drawing Sheets

(56) References Cited

OTHER PUBLICATIONS

D. Lee et al., "Single-crystalline silicon micromirrors actuated by self-aligned vertical electrostatic combdrives with piston-motion and rotation capability," Sensors and Actuators A—Physical, vol. 114, pp. 423-428, 2004.

J. Kim et al., "Microfabricated torsional actuators using self-aligned plastic deformation of silicon," Journal of Microelectromechanical Systems, vol. 15, pp. 553-562, 2006.

* cited by examiner (a)　　　　　　　　(b)

US 8,810,881 B2

MICRO STRUCTURE, MICRO ACTUATORS, METHOD OF FABRICATING MICRO STRUCTURE AND MICRO ACTUATORS

CROSS-REFERENCE TO RELATED PATENT APPLICATION

This application claims the benefit of Korean Patent Application No. 10-2011-0129274, filed on Dec. 5, 2011, in the Korean Intellectual Property Office, the disclosure of which is incorporated herein in its entirety by reference.

BACKGROUND OF THE INVENTION

1. Field of the Invention

The present invention relates to a micro-actuator used as a device for a micro-electro-mechanical system (MEMS) and, more particularly, to a method for fabricating a micro-structure and micro-actuator, which can simply and easily fabricate the micro-structure and micro-actuator using an aligned nano-material array adhesive.

2. Description of the Related Art

In general, a micro-electro-mechanical system (MEMS) refers to a technology that combines an apparatus, in which sensor, valves, gears, reflectors, actuators, electronic circuits, etc., are integrated on a single silicon substrate, or a microscale mechanism, which is mounted in a semiconductor chip, with a computer.

The MEMS technology has evolved from a silicon fabrication process that produces semiconductor chips and, in order to fabricate miniature mechanical components such as valves, motors, pumps, gears, etc. with a three-dimensional structure on a silicon substrate, various MEMS technologies such as surface micromachining, bulk micromachining involving deep etching, lithographie-galvanoformung-abformung (LIGA), etc. have been developed.

Meanwhile, an electrostatically-actuated micro-scanner manufactured based on the MEMS technology is a device that scans optical signals by rotating a micro-mirror using a micro-actuator to change the direction of light. This microscanner has various advantages such as low power consumption, high operating speed, low fabrication cost, etc. and thus is applied to various industries and consumer electronics, and its application is expected to gradually expand.

The micro-actuator installed in the micro-scanner refers to a microscale device configured to be driven by an attractive force produced due to collection of charges caused when a voltage difference occurs between two electrodes which are spaced a predetermined distance from each other. The microactuator may be broadly classified into a parallel plate actuator and a comb-drive actuator depending on the structure of a stator electrode and a rotor electrode.

The parallel plate actuator operates a micro-mirror using the attractive force between two plates to which a voltage is applied and is generally operated by applying a potential difference between the mirror and a substrate located at a predetermined distance from the bottom of the mirror. The comb-drive actuator has a structure in which comb-shaped rotor electrode and stator electrode are staggered alternately and is configured to move the rotor toward the stator using the attractive force produced when a potential difference is applied between the two electrodes.

The comb-drive actuator may be classified into an in-plane comb-drive actuator and a vertical comb-drive actuator of staggered vertical comb-drive (SVC) type and angular vertical comb-drive (AVC) type. The in-plane comb-drive actuator has a structure in which a rotor electrode and a stator electrode are installed on a plane such that the rotor electrode moved toward the stator, thus causing linear motion in the plane.

The vertical capacitive micro-actuator of staggered vertical comb-drive (SVC) type is fabricated to have a predetermined height difference in a state where a stator electrode and a rotor electrode are engaged with each other such that when a potential difference is applied between the two electrode, the rotor receives the attractive force in the direction of the stator and is restrained by a torsion bar, thus using rotary motion with respect to the torsion bar.

The vertical capacitive micro-actuator of angular vertical comb-drive (AVC) type has a structure in which a rotor electrode has an initial rotational angle with respect to a torsion bar and, when an operating voltage is applied between the two electrodes, the rotor electrode is drawn in the direction of the stator electrode and rotated until the stator electrode and the rotor electrode completely overlap each other.

When the vertical capacitive micro-actuator of angular vertical comb-drive (AVC) type is fabricated, the rotor electrode and the stator electrode are engaged with each other in the same plane by a simple micro-processing process and then the rotor electrode has a predetermined initial rotational angle by a post process.

Next, prior art methods to fabricate the vertical capacitive micro-actuators will be described in brief.

First, in the paper of "J. Kim, D. Christensen, and L. W. Lin, entitled: Micro vertical comb actuators by selective stiction process, Sensors and Actuators A-Physical, vol. 127, pp. 248-254, Mar. 13 2006" a selective stiction process is employed to fabricate a vertical comb-drive actuator.

This paper discloses a method for fabricating a vertical comb-drive actuator by causing the selective stiction when an oxide silicon layer located at the bottom of a device silicon layer of a silicon-on-insulator (SOI) wafer is etched to provide an initial vertical height difference between a rotor and a stator.

Moreover, in the paper of "D. Lee, U. Krishnamoorthy, K. Yu, and O. Solgaard, entitled: Single-crystalline silicon micromirrors actuated by self-aligned vertical electrostatic combdrives with piston-motion and rotation capability, Sensors and Actuators A-Physical, vol. 114, pp. 423-428, 2004", another method for fabricating a vertical comb-drive actuator is disclosed.

According to this paper, a vertical comb-drive actuator is fabricated to have a structure in which structures corresponding to a stator and a rotor are formed on an upper silicon layer and a lower silicon layer, respectively, which are electrically insulated from each other by additionally bonding a silicon water to an SOI wafer and then selectively etching a plurality of silicon layers and insulating layers.

Furthermore, in the paper of "J. Kim, H. Choo, L. W. Lin, and R. S. Muller, entitled: Microfabricated torsional actuators using self-aligned plastic deformation of silicon, Journal of Microelectromechanical Systems, vol. 15, pp. 553-562, June 2006", still another method for fabricating a vertical comb-drive actuator is disclosed.

According to this study, a vertical comb-drive actuator is fabricated in such a manner that a comb structure is formed by a micro-processing process, a stress is applied to a silicon torsion bar using a jig structure additionally fabricated, and the silicon torsion bar is heated to be permanently deformed, thus causing an initial vertical position difference between a stator and a rotor.

As mentioned above, the existing vertical capacitive micro-actuator is subjected to an additional process such as etching to cause the selective stiction, selective etching of the plurality of silicon layers and insulating layers after additionally bonding the silicon wafer, or heat treatment to permanently deform the silicon torsion bar, in addition to the microprocessing process.

As such, while the conventional vertical capacitive microactuators are widely applied to various fields such as optical communications, biomedical engineering, image scanning devices, etc., complicated fabrication processes are required, which reduces the fabrication yield, thus making it difficult to reduce the fabrication cost. In particular, among the vertical capacitive actuators, the micro-actuator of AVG type, which is known as having excellent performance, has drawbacks in that the micro-processing process to fabricate the device is complicated, which makes it more difficult to increase the fabrication yield, acting as an obstacle to commercialization.

SUMMARY OF THE INVENTION

The present invention has been made in an effort to solve the above-described problems associated with prior art, and an object of the present invention is to provide a method for fabricating a micro-structure and a micro-actuator, which can simply and easily fabricate the micro-structure and the micro-actuator by a batch process of directly forming a highly aligned nano-material array on a micro-structure to be used as an adhesive material during plastic deformation of the micro-structure without the use of existing complicated fabrication process, and a micro-structure and a micro-actuator fabricated by the above method.

According to an aspect of the present invention to achieve the above object of the present invention, there is provided a method for fabricating a micro-structure, the method comprising: forming a nano-material array on a micro-structure having an initial shape before deformation and allowing the nano-material array to grow for a predetermined time; deforming the micro-structure to a desired shape; performing plastic deformation on the deformed micro-structure in an inert gas atmosphere at high temperature such that deformed state of the micro-structure is maintained by an adhesive force of the nano-material array; and removing the nano-material array, which remains in the plastic-deformed micro-structure, by an oxidation process in an oxidation gas atmosphere at high temperature, or by etching process with an etching fluid.

Herein, The nano-material may be made up of one among C, ZnO, Ge-parylene, $SiC$—$SiO_2$ and GaN which have the adhesive characteristic in dry condition, and may have the shape of one among nano-tube, nano-belt and nano-wire.

The method may further comprise a process of removing the nano-material array and contaminants, which remain in the micro-structure after the oxidation process, with a piranha solution or by oxygen plasma.

The method may further comprise a process of removing an oxide layer, which is formed on the surface of the microstructure through the oxidation process by the oxidation gas at high temperature, with a fluoride solution.

The nano-material array may be formed by chemical vapor deposition (CVD).

According to another aspect of the present invention, there is provided a micro-structure with a three-dimensional shape fabricated by a method comprising: forming a nano-material array on a micro-structure having an initial shape before deformation and allowing the nano-material array to grow for a predetermined time; deforming the micro-structure to a desired shape: performing plastic deformation on the deformed micro-structure in an inert gas atmosphere at high temperature such that deformed state of the micro-structure is maintained by an adhesive force of the nano-material array; and removing the nano-material array, which remains in the plastic-deformed micro-structure, by an oxidation process in an oxidation gas atmosphere at high temperature, or by an etching process with an etching fluid.

According to still another aspect of the present invention, there is provided a method for fabricating a micro-actuator in which a torsion spring is torsionally rotated such that a rotor has a predetermined initial angle with respect to a stator fixed on a substrate, the method comprising: preparing a microactuator shape in an initial state where the stator and the rotor are parallel to each other; forming a nano-material array on surfaces of the stator and the rotor facing each other and allowing the nano-material array to grow for a predetermined time; torsionally deforming the torsion spring such that the rotor has a predetermined initial angle with respect to the stator, maintaining the deformed state using an adhesive force of the nano-material array grown between the stator and the rotor, and performing plastic deformation in an inert gas atmosphere at high temperature; and removing the nano-material array, which remains in the micro-actuator after the plastic deformation, by an oxidation process in an oxidation gas atmosphere at high temperature, or by an etching process with an etching fluid.

Herein, The nano-material may be made up of one among C, ZnO, Ge-parylene, $SiC$—$SiO_2$ and GaN which have the adhesive characteristic in dry condition, and have the shape of one among nano-tube, nano-belt and nano-wire.

The method may further comprise a process of removing the nano-material array and contaminants, which remain in the micro-actuator after the oxidation process, with a piranha solution or by oxygen plasma.

The method may further comprise a process of removing an oxide layer, which is formed on the surface of the microactuator in the oxidation process by the oxidation gas at high temperature, with a fluoride solution.

The nano-material array may be formed by chemical vapor deposition (CVD).

According to yet another aspect of the present invention, there is provided a micro-actuator in which a torsion spring is torsionally rotated such that a rotor has a predetermined initial angle with respect to a stator fixed on a substrate, the micro-actuator being fabricated by a method comprising: preparing a micro-actuator shape in an initial state where the stator and the rotor are parallel to each other; forming a nano-material array on surfaces of the stator and the rotor facing each other and allowing the nano-material array to grow for a predetermined time; torsionally deforming the torsion spring such that the rotor has a predetermined initial angle with respect to the stator, maintaining the deformed state using an adhesive force of the nano-material array grown between the stator and the rotor, and performing plastic deformation in an inert gas atmosphere at high temperature; and removing the nano-material array, which remains in the micro-actuator after the plastic deformation, by an oxidation process in an oxidation gas atmosphere at high temperature, or by an etching process with an etching fluid.

According to still another aspect of the present invention, there is provided a method for fabricating a micro-actuator in which a linear spring is linearly deformed such that a rotor has a predetermined initial displacement with respect to a stator fixed on a substrate, the method comprising: preparing a micro-actuator shape in an initial state where the stator and the rotor are located in a same plane; forming a nano-material array on surfaces of the stator and the rotor facing each other and allowing the nano-material array to grow for a predetermined time; linearly deforming the linear spring such that the rotor has a predetermined initial displacement with respect to the stator, maintaining the deformed state using an adhesive force of the nano-material array grown between the stator and the rotor, and performing plastic deformation in an inert gas atmosphere at high temperature; and removing the nano-material array, which remains in the micro-actuator after the plastic deformation, by an oxidation process in an oxidation gas atmosphere at high temperature, or by an etching process with an etching fluid.

Herein, The nano-material may be made up of one among C, ZnO, Ge-parylene, SiC—SiO$_2$ and GaN which have the adhesive characteristic in dry condition, and have the shape of one among nano-tube, nano-belt and nano-wire.

The method may further comprise a process of removing the nano-material array and contaminants, which remain in the micro-actuator after the oxidation process, with a piranha solution or by oxygen plasma.

The method may further comprise a process of removing an oxide layer, which is formed on the surface of the micro-actuator in the oxidation process by the oxidation gas at high temperature, with a fluoride solution.

The nano-material array may be formed by chemical vapor deposition (CVD).

According to yet another aspect of the present invention, there is provided a micro-actuator in which a linear spring is linearly deformed such that a rotor has a predetermined initial displacement with respect to a stator fixed on a substrate, the micro-actuator being fabricated by a method comprising: preparing a micro-actuator shape in an initial state where the stator and the rotor are located in a same plane; forming a nano-material array on surfaces of the stator and the rotor facing each other and allowing the nano-material array to grow for a predetermined time; linearly deforming the linear spring such that the rotor has a predetermined initial displacement with respect to the stator, maintaining the deformed state using an adhesive force of the nano-material array grown between the stator and the rotor, and performing plastic deformation in an inert gas atmosphere at high temperature; and removing the nano-material array, which remains in the micro-actuator after the plastic deformation, by an oxidation process in an oxidation gas atmosphere at high temperature, or by an etching process with an etching fluid.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, exemplary embodiments of the present invention will be described in detail with reference to the accompanying drawings.

Figure 1:
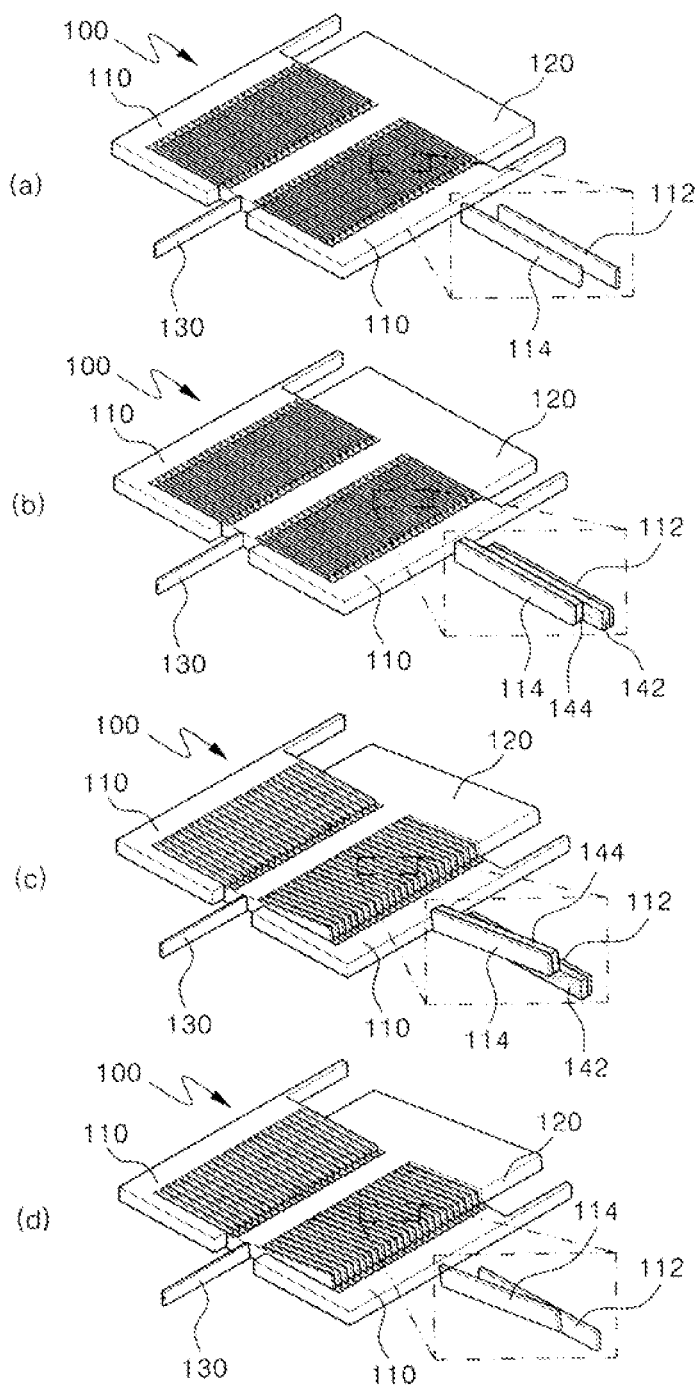
FIG. 1 is a diagram sequentially showing a process of fabricating a micro-actuator which was a torsion spring according to the present invention.

FIG. 1 is a diagram sequentially showing a process of fabricating an AVC micro-actuator which has a torsion spring according to the present invention.

Referring to FIG. 1, an angular vertical comb-drive (AVC) actuator 100 as a micro-structure comprises two stators 110 fixed on a substrate (not shown) and a rotor 120 disposed between the two stators 110, connected to the substrate through a torsion spring 130, and rotating at a predetermined angle with respect to the stators 110 when a voltage is applied thereto.

Each of the stator 110 and the rotor 120 has a plurality of fingers 112 and 114 arranged in the form of a comb, the fingers 112 and 114 of the stator 110 and the rotor 120 being engaged with each other.

Meanwhile, the torsion spring 130 extends outward to both sides of the center of the rotor 120 and is supported on the substrate. After the finger 112 of the stator 110 and the finger 114 of the rotor 120 are arranged on the same plane by a typical silicon fabrication process as shown in (a) of FIG. 1, the torsion spring 130 is subjected to plastic deformation such that the rotor 120 has a predetermined initial angle with respect to the stator 110 as shown in (d) of FIG. 1.

As such, when the shape of (a) of FIG. 1 of the micro-actuator is turned into the shape of (d) of FIG. 1 through the plastic deformation of the torsion spring 130, the rotor 120 of the actuator is rotated about the torsion spring 130 as an axis by electrostatic force in the out-of-plane direction generated by an electric field imbalance occurring when a potential difference is applied to two electrodes of the stator 110 and the rotor 120.

The micro-actuator 100 in which the torsion spring 130 is torsionally rotated such that the rotor 120 has a predetermined initial angle with respect to the stator 110 is fabricated by the following process using a nano-material array.

First, the structure of the micro-actuator 100 in which the stator 110 and the rotor 120 are positioned parallel to each other on the same plane is fabricated by a typical silicon fabrication process as shown in (a) of FIG. 1. Here, the rotor 120 of the micro-actuator 100 does not have an initial angle with respect to the stator 110, and the torsion spring 130 is maintained without torsional deformation.

In this state, as shown in (b) of FIG. 1, a nano-material array aligned at high density is formed on the structure of the micro-actuator 100 to cover the surface of a silicon structure. When the surface of the silicon structure is covered, nano-material array 142 and 144 fill a space between the finger 112 of the stator 110 and the finger 114 of the rotor 120 as shown in (b) of FIG. 1. Then, the nano-material array 142 and 144, formed between the side of the finger 112 of the stator 110 and the side of the finger 114 of the rotor 120, are subjected to a growth process for a predetermined time. Here, the nano-material array 142 and 144 grown from both sides of the fingers 112 and 114 are brought into contact with each other at a midpoint between the fingers 112 and 114, thus forming a boundary.

Herein, the nano-material may be made up of one among C, ZnO, Ge-parylene, SiC—$SiO_2$ and GaN, which has which has adhesive characteristic in dry condition, and have the shape of one among nano-tube, nano-belt and nano-wire. The adhesive characteristic in dry condition of nano-materials above can be ascertained through reference [A1]~[A3].

Thereafter, as shown in (c) of FIG. 1, the rotor 120 of the micro-actuator 100 is rotated at a predetermined angle to apply a torsional stress to the torsion spring 130 to be deformed. Here, an adhesive force is produced at a place where the nano-material array 144 and 142 grown from both sides of the finger 114 of the rotor 120 and the finger 112 of the stator 110 meet each other, and thus the torsion spring 130 maintains its distorted shape even after the force of rotating the rotor 120 is removed as shown in (c) of FIG. 1. This is because the Van der Waals force acts between the nano-material array grown from both sides to produce an adhesive force, which maintains the distorted state.

When the torsion spring 130 having the torsional deformation is subjected to a heating process at a high temperature up to 900° C., the torsion spring 130 is permanently plastic-deformed. Here, to protect the nano-material array 142 and 144 at high temperature, the high temperature heating process is performed in an inert gas (nitrogen) atmosphere.

After the plastic deformation of the micro-actuator in an inert gas atmosphere at high temperature is completed, the nano-material array used as an adhesive material is no longer needed. Thus, the inert gas atmosphere is changed to an air atmosphere at high temperature such that the nano-material array 142 and 144 formed in the micro-actuator are oxidized and removed, thus completing the structure of silicon micro-actuator 100 as shown in (d) of FIG. 1.

Figure 13:
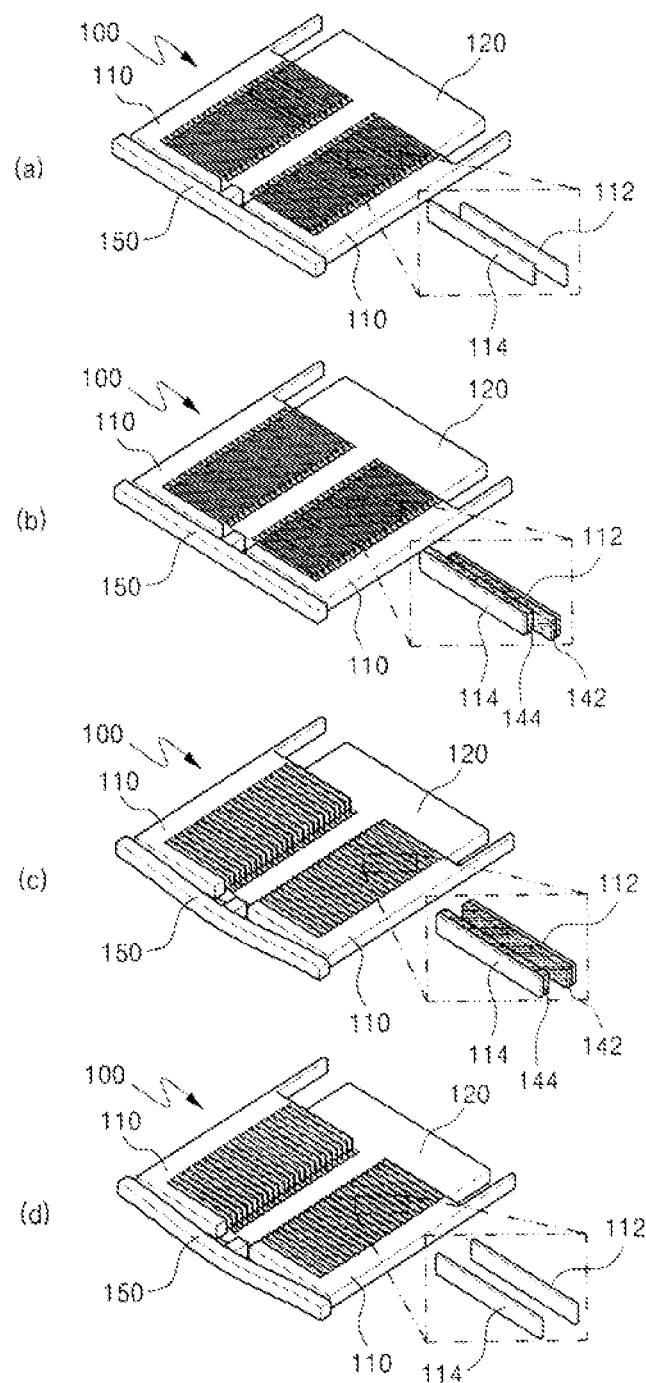
FIG. 13 is a diagram sequentially showing a process of fabricating a micro-actuator which has a linear spring according to the present invention.
Figure 14:
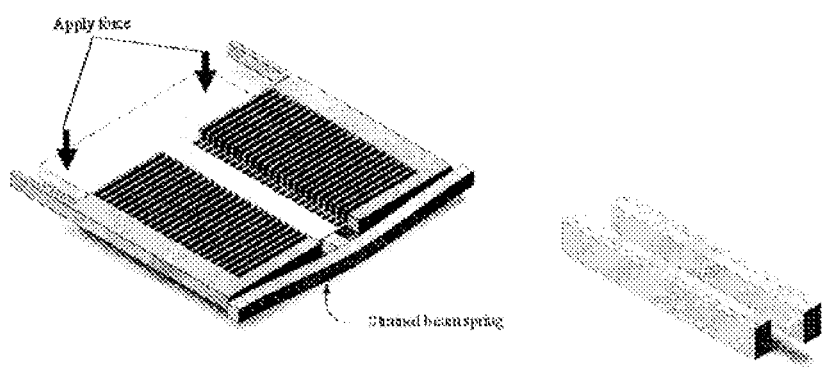
FIG. 14 is a diagram showing the micro-actuator which has been linearly deformed and is maintaining the deformed state using an adhesive force of the nano-material array grown between the stator and the rotor.
Figure 15:
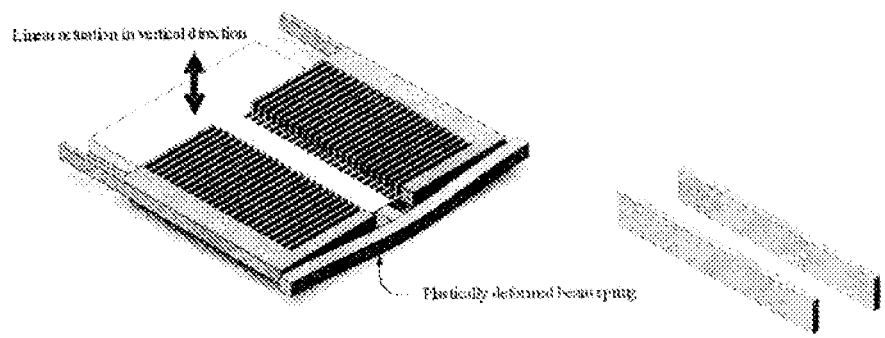
FIG. 15 is a diagram showing the micro-actuator which the nano-material array has been removed from, after the plastic-deformation.

FIG. 13 is a diagram sequentially showing a process of fabricating a micro-actuator which has a linear spring according to the present invention.

Referring to FIG. 13, an micro-actuator 100 as a micro-structure comprises two stators 110 fixed on a substrate (not shown) and a rotor 120 disposed between the two stators 110, connected to the substrate through a linear spring 150, and moving at a predetermined position with respect to the stators 110 when a voltage is applied thereto.

Herein, although a rotor generally means a mechanical rotary element, the rotor 120 shown in FIG. 13 indicates a mechanical element not rotationally but linearly moving.

Each of the stator 110 and the rotor 120 has a plurality of fingers 112 and 114 arranged in the form of a comb, the fingers 112 and 114 of the stator 110 and the rotor 120 being engaged with each other.

Meanwhile, the linear spring 150 may be a bending spring which has a beam shape and it's both sides are supported on the substrate. The both centers of rotor 120 extend outward and they are connected to the centers of the bending spring. After the finger 112 of the stator 110 and the finger 114 of the rotor 120 are arranged on the same plane by a typical silicon fabrication process as shown in (a) of FIG. 13, the linear spring 150 is subjected to plastic deformation such that the rotor 120 has a predetermined initial displacement with respect to the stator 110 as shown in (d) of FIG. 13.

As such, when the shape of (a) of FIG. 13 of the micro-actuator is turned into the shape of (d) of FIG. 13 through the plastic deformation of the linear spring 150. Then, the rotor 120 of the actuator is moved into the same plane with the stator 110 by electrostatic force generated by an electric field imbalance occurring when a potential difference is applied to two electrodes of the stator 110 and the rotor 120.

The micro-actuator 100 in which the linear spring 150 is linearly deformed such that the rotor 120 has a predetermined initial displacement with respect to the stator 110 is fabricated by the following process using a nano-material array.

First, the structure of the micro-actuator 100 in which the stator 110 and the rotor 120 are positioned parallel to each other on the same plane is fabricated by a typical silicon fabrication process as shown in (a) of FIG. 13. Here, the rotor 120 of the micro-actuator 100 does not have an initial displacement with respect to the stator 110, and the linear spring 150 is maintained without linear deformation.

In this state, as shown in (b) of FIG. 13, a nano-material array aligned at high density is formed on the structure of the micro-actuator 100 to cover the surface of a silicon structure. When the surface of the silicon structure is covered, the nano-material array 142 and 144 fills a space between the finger 112 of the stator 110 and the finger 114 of the rotor 120 as shown in (b) of FIG. 13. Then, the nano-material array 142 and 144, formed between the side of the finger 112 of the stator 110 and the side of the finger 114 of the rotor 120, are subjected to a growth process for a predetermined time. Here, the nano-material array 142 and 144 grown from both sides of the fingers 112 and 114 are brought into contact with each other at a midpoint between the fingers 112 and 114, thus forming a boundary.

Herein, the nano-material may be made up of one among C, ZnO, Ge-parylene, SiC—$SiO_2$ and GaN, which has which has adhesive characteristic in dry condition, and have the shape of one among nano-tube, nano-belt and nano-wire. The adhesive characteristic in dry condition of these nano-materials above can be ascertained through reference [A1]~[A3].

Thereafter, as shown in (c) of FIG. 13, the rotor 120 of the micro-actuator 100 is moved at a predetermined displacement to apply a linear stress to the linear spring 150 to be deformed. Here, an adhesive force is produced at a place where the nano-material array 144 and 142 grown from both sides of the finger 114 of the rotor 120 and the finger 112 of the stator 110 meet each other, and thus the linear spring 150 maintains its distorted shape even after the force of pushing the rotor 120 is removed as shown in (c) of FIG. 13. This is because the Van der Waals force acts between the nano-material array grown from both sides to produce an adhesive force, which maintains the distorted state.

When the linear spring 150 having the linear deformation is subjected to a heating process at a high temperature up to 900° C., the linear spring 150 is permanently plastic-deformed. Here, to protect the nano-material array 142 and 144 at high temperature, the high temperature heating process is performed in an inert gas (nitrogen) atmosphere.

After the plastic deformation of the micro-actuator in an inert gas atmosphere at high temperature is completed, the nano-material array used as an adhesive material is no longer needed. Thus, the inert gas atmosphere is changed to an air atmosphere at high temperature such that the nano-material array 142 and 144 formed in the micro-actuator are oxidized and removed, thus completing the structure of silicon micro-actuator 100 as shown in (d) of FIG. 13.

In FIG. 13, a bending spring, more specifically a beam spring, is introduced as the linear spring. According to this invention, however, various types of linear springs, which can be linearly deformed and have linear-elastic characteristic, are used as the linear spring, instead of the bending spring.

Meanwhile, for a demonstration of the method for fabricating the micro-actuator according to the present invention, in the experiment, silicon micro-structures were formed on a silicon-on-insulator wafer by a batch process, and then a carbon nanotube array was formed on the surface of the micro-structures by catalytic thermal chemical vapor deposition (CVD).

After forming the carbon nanotube array, carbon nanotubes are allowed to grow, and then the rotor 120 of the AVC actuator 100 is rotated at a predetermined angle to apply a torsional stress to the torsion spring 130 to be deformed. Then, the deformed state is maintained and fixed by the adhesive force between the carbon nanotubes. Here, the adhesive force between the carbon nanotubes is sufficient to overcome the restoring force of the torsion spring 130, and thus it is possible to maintain the deformed state of the torsion spring 130.

Here, the adhesive force between the carbon nanotubes 142 and 144 formed on the structure of the micro-actuator 100 is expected to be affected by the density of the carbon nanotubes, but it has been known that it is very difficult to control the number density of the carbon nanotubes. Thus, it is more realistic to control the number density by controlling the area, where the carbon nanotubes are formed, by modifying the design of the micro-structure such that the adhesive force is increased or decreased.

In the state where the micro-actuator structure with the carbon nanotube array is deformed, the micro-structure is finally subjected to a heating process in an inert gas atmosphere at a high temperature of 900° C. Here, after the heating process for a predetermined time, the inert nitrogen gas atmosphere is sequentially changed to an air atmosphere. The silicon micro-structure deformed by stress during the heating process in a nitrogen gas atmosphere maintains its deformed state by the adhesive force of the carbon nanotube array and is subjected to plastic deformation. The plastic deformation of the microstructure is performed in an inert gas atmosphere at high temperature, and thus the carbon nanotubes formed on the surface of the silicon micro-structure are preserved to maintain and fix the deformed silicon structure.

When the plastic deformation of the silicon micro-structure is completed, the atmosphere is changed to an air atmosphere while maintaining the high temperature. Then, the carbon nanotubes formed on the silicon micro-structure are oxidized by air and removed, producing carbon dioxide ($CO_2$) gas. After the high temperature heating process, a cleaning process with a piranha solution or by oxygen plasma is performed to remove carbon nanotubes, contaminants, etc. which may remain. Finally, an oxide silicon layer that may be formed on the surface of the silicon micro-structure during the high temperature heating process is removed with a fluoride solution, thus completing the silicon micro-structure in the form of a final product.

Figure 2:
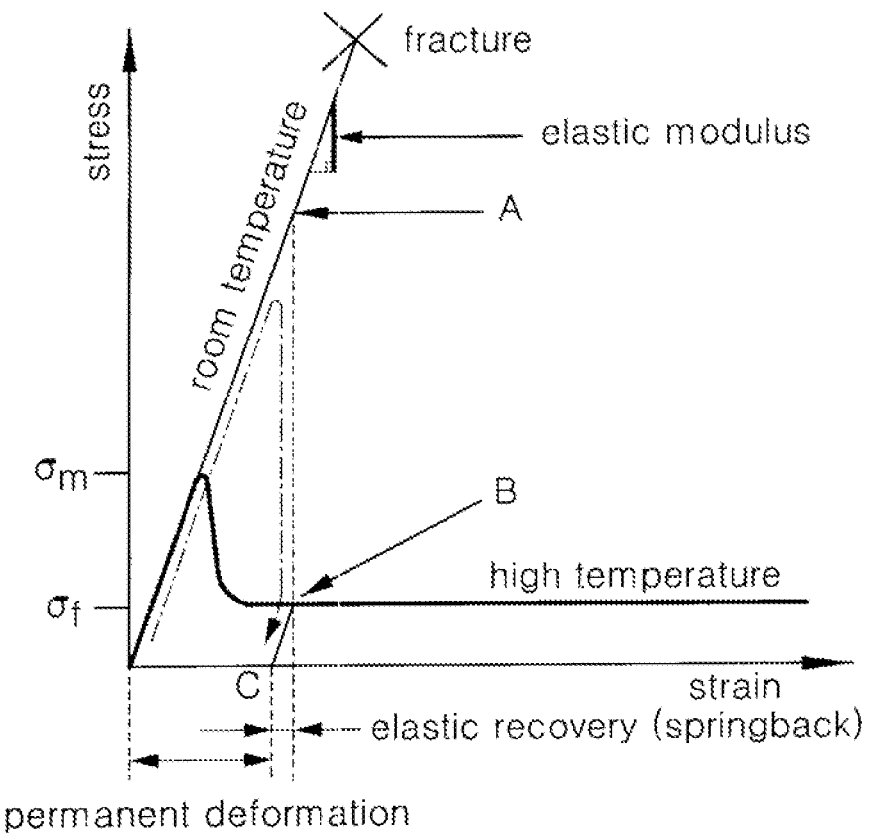
FIG. 2 is a graph showing the relationship between stress and strain during plastic deformation of single crystal silicon used in the fabrication of the micro-actuator according to the present invention.

FIG. 2 is a graph showing the relationship between stress and strain of single crystal silicon at high temperature during the fabrication of the silicon micro-structure using the carbon nanotube array. As can be seen from FIG. 2, while the silicon is a brittle material at room temperature, the yield strength of the silicon is significantly reduced at high temperature. That is, at high temperature, the silicon starts to behave like a ductile material and is subjected to plastic deformation at a temperature of 600° C. or higher. Moreover, the flow stress, $\sigma_f$ required for the plastic deformation decreases as the temperature increases (the relationship between stress and strain of single crystal silicon is well described in the following reference [S1]).

Here, the method for fabricating the silicon micro-structure according to the present invention progresses along the blue line shown in the graph of FIG. 2. In detail, the carbon nanotube array adhesive formed on the silicon micro-structure of the present invention fixedly maintains the deformed silicon structure to which a stress above the yield strength $\sigma_m$ is applied (point A of the graph of FIG. 2). Then, when the silicon structure is heated at a temperature of 900° C. in an inert gas atmosphere, it reaches point B of the graph of FIG. 2, and thus the silicon is subjected to plastic deformation. Finally, the carbon nanotubes, which are no longer needed after the plastic deformation, are oxidized in an oxidation gas atmosphere (see the following reference [S2]) and removed. Here, the adhesive force between the carbon nanotubes also disappears, and thus the silicon is elastically recovered to point C of the graph of FIG. 2. Here, point C of the graph of FIG. 2 represents the strain where the plastic deformation occurs.

Next, the results of the silicon micro-structure fabricated by the method using the carbon nanotubes according to the present invention will be described.

Figure 3:
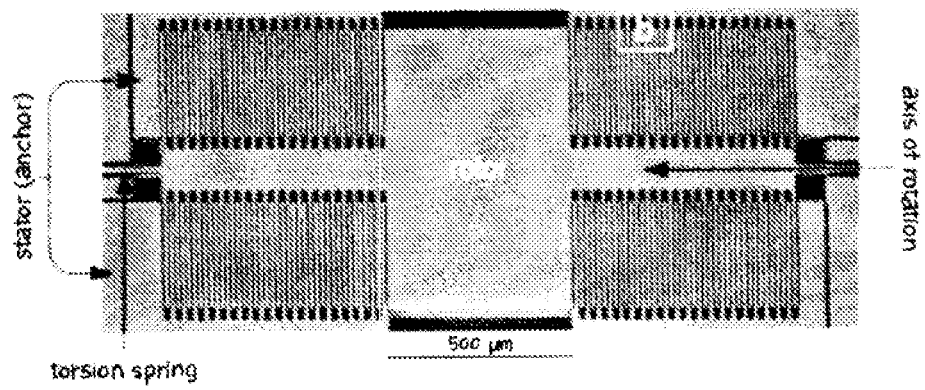
FIG. 3 is a scanning electron microscope (SEM) image of a micro-actuator in which a carbon nanotube array is formed according to the present invention.
Figure 4:
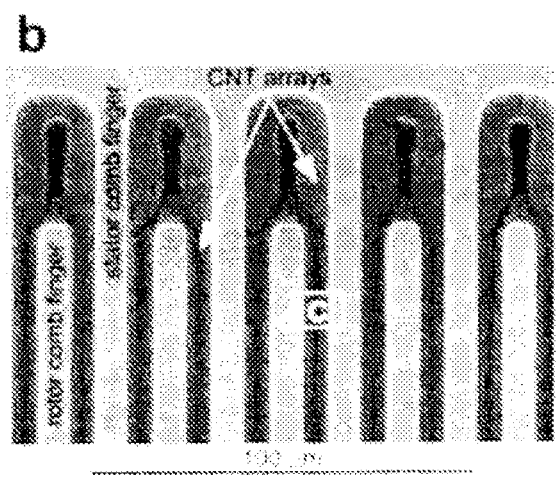
FIG. 4 is an enlarged image of portion (b) of FIG. 3.
Figure 5:
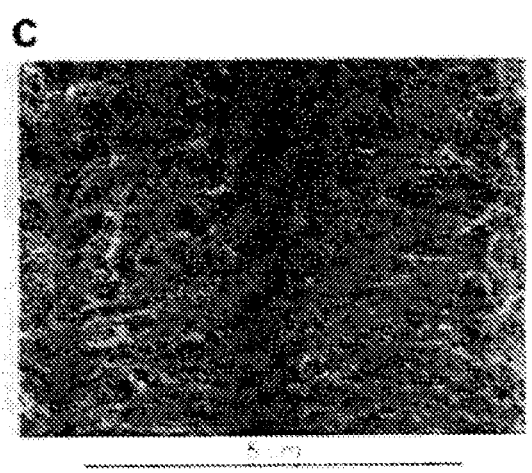
FIG. 5 is an enlarged image of portion (c) of FIG. 3.

FIG. 3 is a scanning electron microscope (SEM) image of a micro-actuator as the silicon micro-structure in which the carbon nanotube array aligned at high density is formed by the above-described method of the present invention. FIG. 4 is an enlarged image of portion (b) of FIG. 3, ad FIG. 5 is an enlarged image of portion (c) of FIG. 3.

It can be seen from the enlarged image of the rotor and the stator in FIG. 3 that the high density carbon nanotube array completely fills the space between the comb-fingers of the stator and the comb-fingers of the rotor. Moreover, it can be seen from the further enlarged image of FIG. 5 that the carbon nanotube array is aligned in a direction perpendicular to the sides of the comb-finger of the stator and the comb-finger of the rotor. Here, it can be seen from FIG. 5 that an adhesive force is produced between the carbon nanotubes facing each other between the comb-fingers of the stator and the rotor.

Figure 6:
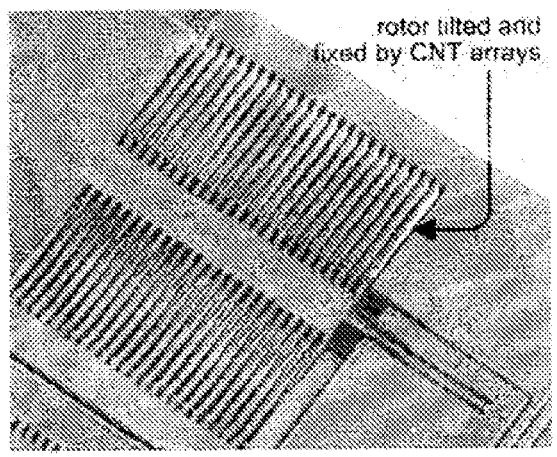
FIG. 6 is an SEM image showing a micro-actuator according to the present invention in which a torsion spring is deformed and fixed by a carbon nanotube array adhesive after a rotor is tilted.
Figure 7:
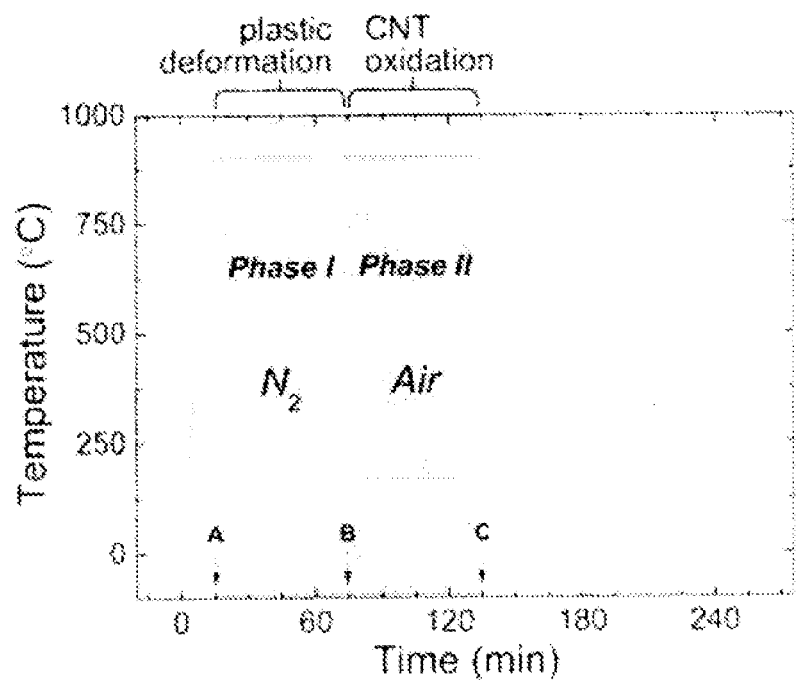
FIG. 7 is a graph showing a change in gas atmosphere along with the temperature and time in the process of fabricating the micro-actuator according to the present invention.

FIG. 6 is an SEM image showing an AVC micro-actuator in which the torsion spring is deformed and fixed by the carbon nanotube array adhesive after the rotor of the micro-actuator is tilted. That is, FIG. 6 shows a state in which the adhesive force between the carbon nanotubes and the restoring force of the torsion spring is balanced such that the micro-actuator is fixed. The micro-actuator fixed by the carbon nanotube array is sequentially subjected to a high temperature process in a nitrogen gas atmosphere and in an air atmosphere. FIG. 7 shows a change in gas atmosphere along with the temperature and time occurring during the heating process at high temperature.

Figure 8:
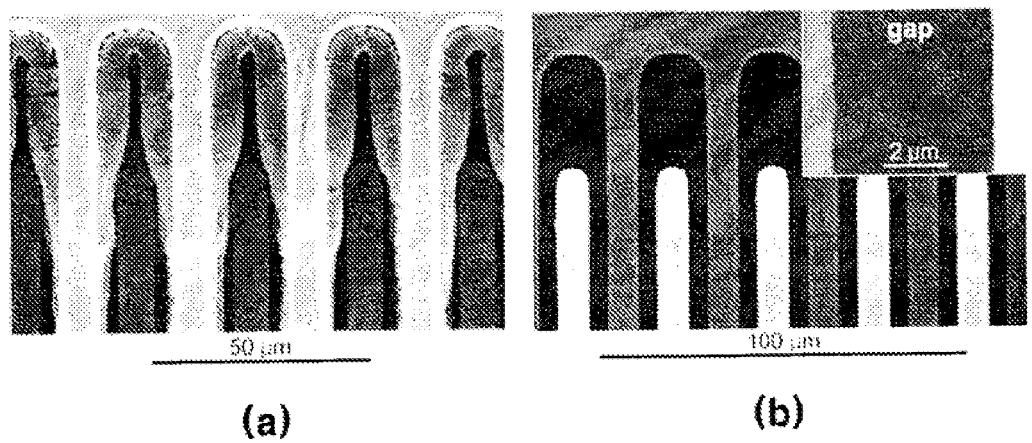
FIG. 8 is an SEM image showing the surroundings of a rotor of a micro-actuator after plastic deformation before and after a carbon nanotube array is removed.

FIG. 8 is an SEM image showing the surroundings of a rotor of a micro-actuator after plastic deformation before and after a carbon nanotube array is removed.

Here, (a) of FIG. 8 shows a state in which the plastic deformation of the micro-actuator structure is completed by the high temperature process in a nitrogen gas atmosphere before the carbon nanotubes are removed. It can be seen from the image of (a) of FIG. 8 that the carbon nanotube array is preserved between the comb-fingers of the stator and the rotor after the high temperature process in a nitrogen gas atmosphere. On the contrary, (b) of FIG. 8 shows a state in which the carbon nanotube array is oxidized and removed by the change to the air atmosphere.

Figure 9:
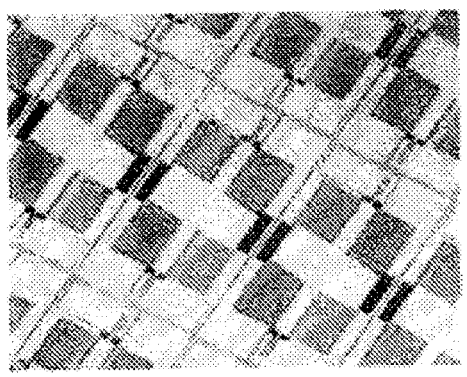
FIG. 9 is an SEM image of a micro-scanner array based on a micro-actuator fabricated by the method of the present invention.
Figure 10:
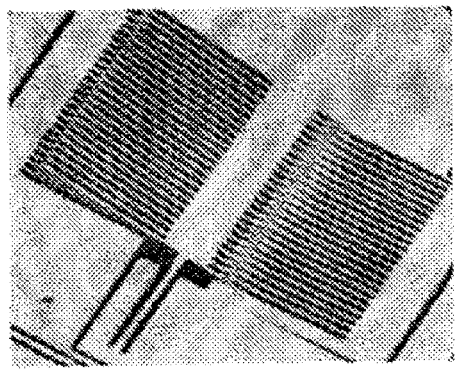
FIG. 10 is a partially enlarged SEM image of a micro-actuator in the micro-actuator of FIG. 9.
Figure 11:
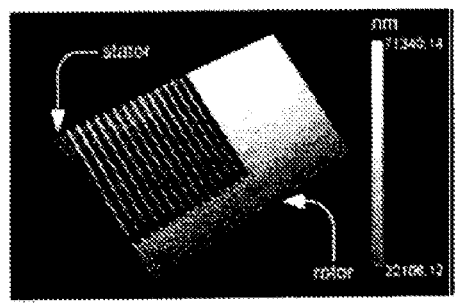
FIG. 11 is an image of a main part of a micro-actuator fabricated by the method of the present invention, the image being taken by white light interferometry.

FIG. 9 is an SEM image of an AVC actuator-based micro-scanner array fabricated by the above-described method using the carbon nanotube array, and FIG. 10 shows a partially enlarged SEM image of a micro-actuator in the micro-actuator of FIG. 9. Moreover, FIG. 11 shows image of a main part of a micro-actuator fabricated by the method of the present invention, the image being taken by white light interferometry.

Figure 12:
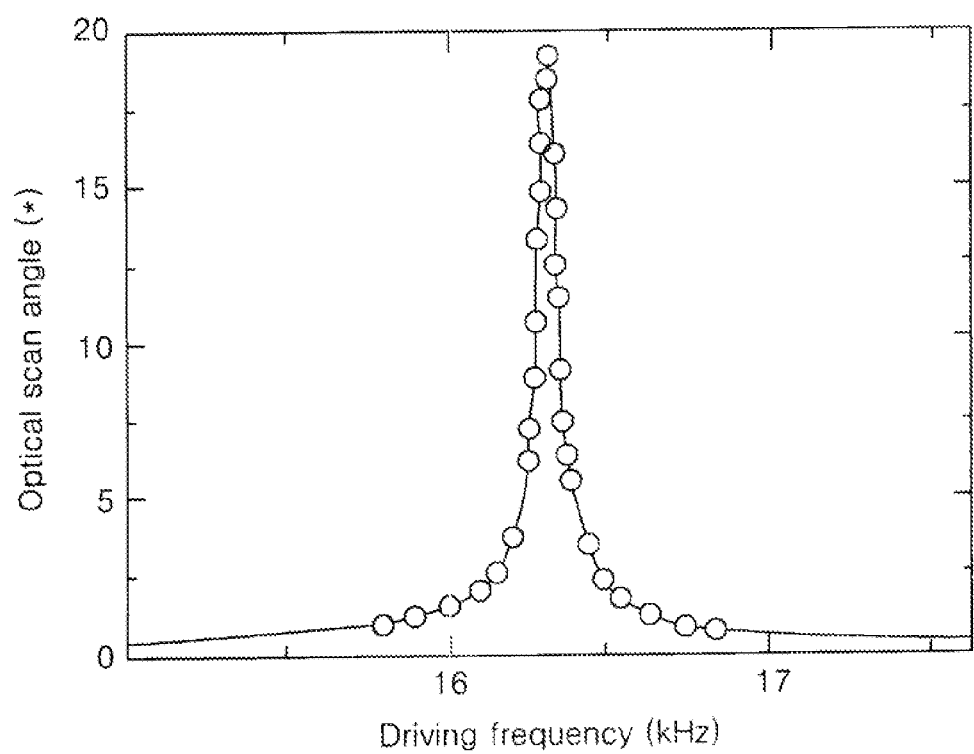
FIG. 12 is a graph showing the results of a scanning test performed in a resonant mode to evaluate the performance of a micro-scanner fabricated by the method of the present invention.

Meanwhile, FIG. 12 is a graph showing the results of a performance evaluation performed on a micro-scanner fabricated by the method of the present invention. In this experiment, a scanning test was performed in a resonant mode to evaluate the performance of the micro-scanner actuator fabricated by the method of the present invention. When the micro-scanner was driven with a square-wave of 0 to 45 V having a 50% duty cycle, an optical scanning angle of 19.3° could be obtained at a driving frequency of 16.3 kHz as shown in FIG. 12.

As can be seen from the above experiment results, the micro-structure with a three-dimension shape could be easily fabricated using the removable carbon nanotube array as an adhesive material during the high temperature silicon fabrication process. In particular, the AVC actuator could be simply fabricated according to the method provided by the present invention without additional design change. Moreover, after the fabrication method is completed, the carbon nanotube array which is no longer needed could be readily removed through the oxidation process. Thus, it is possible to apply the carbon nanotube array to the fabrication of three-dimensional micro-structures of various shapes by employing the fabrication method introduced in the present invention and further to the application fields in severe temperature environments.

As described above, according to the present invention, it is possible to simply and easily fabricate the micro-structure and the micro-actuator by a batch process of directly forming a highly aligned carbon nanotube array on a micro-structure to be used as an adhesive material during plastic deformation of the micro-structure. Moreover, after the plastic deformation, it is possible to readily remove the carbon nanotube array by oxidation in an air atmosphere. Thus, the present invention can perform a batch process using the aligned carbon nanotube array as an adhesive material and achieve high yield and uniformity compared to the existing fabrication methods.

Moreover, the method for fabricating the micro-structure using the carbon nanotube array according to the present invention can be applied to the fabrication of a wide variety of micro-actuators such as 1-axis and 2-axis micro scanners, micro-mirrors, vertical stages, lens actuators, variable capacitors, etc.

While the invention has been particularly shown and described with reference to exemplary embodiments thereof, it will be understood by those of ordinary skill in the art that various changes in form and details may be made therein without departing from the spirit and scope of the invention as defined by the following claims.

Reference [A1]: Hyunhyub Ko, Zhenxing Zhang, Johnny C. Ho, Kuniharu Takei, Rehan Kapadia, Yu-Lun Chueh, Weizhen Cao, Brett A. Cruden, and Ali Javey, "Flexible Carbon-Nanofiber Connectors with Anisotropic Adhesion Properties," Small, Vol. 6, 22-26, 2010.

Reference [A2]: Hyunhyub Ko, Jongho Lee, Bryan E. Schubert, Yu-Lun Chueh, Paul W. Leu, Ronald S. Fearing, and Ali Javey, "Hybrid Core-Shell Nanowire Forests as Self-Selective Chemical Connectors," Nano Letters, Vol. 9, 2054-2058, 2009.

Reference [A3]: Hyun Woo Shim, J. D. Kuppers, and Hanchen Huang, "Strong friction of silicon carbide nanowire films," Nanotechnology, Vol. 20, 025704, 2009.

Reference [S1]: J. R. Patel, A, R. Chaudhuri, *J. Appl. Phys.* 1963, 34, 2788.

Reference [S2]: R. Brukh, S. Mitra, *J. Mater. Chem.* 2007, 17, 619.

What is claimed is:

1. A method for fabricating a microstructure, the method comprising: forming a nano-material array, which has adhesive characteristic in dry condition, on a micro-structure having an initial shape before deformation and allowing the nano-material array to grow for a predetermined time; deforming the micro-structure to a desired shape; performing plastic deformation on the deformed micro-structure in an inert gas atmosphere at high temperature such that deformed state of the micro-structure is maintained by an adhesive force of nano-material array; and removing the nano-material array, which remains in the micro-structure after the plastic deformation.

2. The method of claim 1, wherein the removing the nano-material array is performed by an oxidation process in an oxidation gas atmosphere at high temperature.

3. The method of claim 1, wherein the removing the nano-material array is performed by an etching fluid.

4. The method of claim 1, wherein the nano-material is made up of one among C, ZnO, Ge-parylene, $SiC$—$SiO_2$ and GaN which have the adhesive characteristic in dry condition.

5. The method of claim 1, wherein the nano-material has the shape of one among nano-tube, nano-belt and nano-wire.

6. The method of claim 2, further comprising removing the nano-material array and contaminants, which remain in the micro-structure after the oxidation process, with a piranha solution or by oxygen plasma.

7. The method of claim 6, further comprising removing an oxide layer, which is formed on the surface of the micro-structure through the oxidation process by the oxidation gas at high temperature, with a fluoride solution.

8. The method of claim 1, wherein the nano-material array is formed by chemical vapor deposition (CVD).

9. A micro-structure fabricated by a method comprising: forming a nano-material array on a micro-structure having an initial shape before deformation and allowing the nano-material array to grow for a predetermined time; deforming the micro-structure to a desired shape; performing plastic deformation on the deformed micro-structure in an inert gas atmosphere at high temperature such that deformed state of the micro-structure is maintained by an adhesive force of the nano-material array; and removing the nano-material array, which remains in the micro-structure after the plastic deformation.

10. A method for fabricating a micro-actuator in which a torsion spring is torsionally rotated such that a rotor has a predetermined initial angle with respect to a stator fixed on a substrate, the method comprising: preparing a micro-actuator shape in an initial state where the stator and the rotor are parallel to each other; forming a nano-material array on surfaces of the stator and the rotor facing each other and allowing the nano-material array to grow for a predetermined time; torsionally deforming the torsion spring such that the rotor has a predetermined initial angle with respect to the stator, maintaining the deformed state using an adhesive force of the nano-material array grown between the stator and the rotor, and performing plastic deformation in an inert gas atmosphere at high temperature; and removing the nano-material array, which remains in the micro-actuator after the plastic deformation.

11. The method of claim 10, wherein the removing the nano-material array is performed by an oxidation process in an oxidation gas atmosphere at high temperature.

12. The method of claim 10, wherein the removing the nano-material array is performed by an etching fluid.

13. The method of claim 10, wherein the nano-material is made up of one among C, ZnO, Ge-parylene, SiC—$SiO_2$ and GaN which have the adhesive characteristic in dry condition.

14. The method of claim 10, wherein the nano-material has the shape of one among nano-tube, nano-belt and nano-wire.

15. The method of claim 11, further comprising removing the nano-material array and contaminants, which remain in the micro-actuator after the oxidation process, with a piranha solution or by oxygen plasma.

16. The method of claim 15, further comprising removing an oxide layer, which is formed on the surface of the micro-actuator through the oxidation process by the oxidation gas at high temperature, with a fluoride solution.

17. The method of claim 10, wherein the nano-material array is formed by chemical vapor deposition (CVD).

18. A micro-actuator in which a torsion spring its torsionally rotated such that a rotor has a predetermined initial angle with respect to a stator fixed on a substrate, the micro-actuator being fabricated by a method comprising: preparing a micro-actuator shape in an initial state where the stator and the rotor are parallel to each other; forming a nano-material array on the surfaces of the stator and the rotor facing each other and allowing the nano-material array to grow for a predetermined time; torsionally deforming the torsion spring such that the rotor has a predetermined initial angle with respect to the stator, maintaining the deformed state using an adhesive force of the nano-material array grown between the stator and the rotor, and performing plastic deformation in an inert gas atmosphere at high temperature; and removing the nano-material array, which remains in the micro-actuator after the plastic deformation.

19. A method for fabricating a micro-actuator in which a linear spring is linearly deformed such that a rotor has a predetermined initial displacement with respect to a stator fixed on a substrate, the method comprising: preparing a micro-actuator shape in an initial state where the stator and the rotor are located in a same plane; forming a nano-material array on surfaces of the stator and the rotor facing each other and allowing the nano-material array to grow for a predetermined time; linearly deforming the linear spring such that the rotor has a predetermined initial displacement with respect to the stator, maintaining the deformed state using an adhesive force of the nano-material array grown between the stator and the rotor, and performing plastic deformation in an inert gas atmosphere at high temperature; and removing the nano-material array, which remains in the micro-actuator after the plastic deformation.

20. The method of claim 19, wherein the removing the nano-material array is performed by an oxidation process in an oxidation gas atmosphere at high temperature.

21. The method of claim 19, wherein the removing the nano-material array is performed by an etching fluid.

22. The method of claim 19, wherein the nano-material is made up of one among C, ZnO, Ge-parylene, SiC—$SiO_2$ and GaN which have the adhesive characteristic in dry condition.

23. The method of claim 19, wherein the nano-material has the shape of one among nano-tube, nano-belt and nano-wire.

24. The method of claim 20, further comprising removing the nano-material array and contaminants, which remain in the micro-actuator after the oxidation process, with a piranha solution or by oxygen plasma.

25. The method of claim 24, further comprising removing an oxide layer, which is formed on the surface of the micro-actuator through the oxidation process by the oxidation gas at high temperature, with a fluoride solution.

26. The method of claim 19, wherein the nano-material array is formed by chemical vapor deposition (CVD).

27. A micro-actuator in which a linear spring is linearly deformed such that a rotor has a predetermined initial displacement with respect to a stator fixed on a substrate, the micro-actuator being fabricated by a method comprising, the micro-actuator being fabricated by a method comprising: preparing a micro-actuator shape in an initial state where the stator and the rotor are located in a same plane; forming a nano-material array on surfaces of the stator and the rotor facing each other and allowing the nano-material array to grow for a predetermined time linearly deforming the linear spring such that the rotor has a predetermined initial displacement with respect to the stator, maintaining the deformed state using an adhesive force of the nano-material array grown between the stator and the rotor, and performing plastic deformation in an inert gas atmosphere at high temperature; and removing the nano-material array, which remains in the micro-actuator after the plastic deformation.

* * * * *